United States Patent [19]

Marz

[11] Patent Number: 5,390,346
[45] Date of Patent: Feb. 14, 1995

[54] SMALL FREQUENCY STEP UP OR DOWN CONVERTERS USING LARGE FREQUENCY STEP SYNTHESIZERS

[75] Inventor: Daniel J. Marz, Richboro, Pa.

[73] Assignee: General Instrument Corporation of Delaware, Hatboro, Pa.

[21] Appl. No.: 184,572

[22] Filed: Jan. 21, 1994

[51] Int. Cl.$^6$ .......................... H04B 1/26; H04N 5/50
[52] U.S. Cl. ...................... 455/260; 455/76; 455/209; 455/316; 348/735
[58] Field of Search .................. 455/207–209, 455/76–77, 314–318, 257–260, 265; 348/726, 731, 732, 735; 358/191.1, 195.1

[56] References Cited

U.S. PATENT DOCUMENTS

| | | | |
|---|---|---|---|
| 4,225,974 | 9/1980 | Miyamoto | 455/207 |
| 4,315,333 | 2/1982 | Yamashita et al. | 455/189 |
| 4,385,402 | 5/1983 | Barrs | 455/339 |
| 4,545,072 | 10/1985 | Skutta et al. | 455/183 |
| 4,562,472 | 12/1985 | Carlson | 358/197 |
| 4,926,130 | 5/1990 | Weaver | 328/14 |
| 5,038,404 | 8/1991 | Marz | 455/118 |
| 5,220,688 | 6/1993 | Tao | 455/314 |

Primary Examiner—Edward F. Urban
Assistant Examiner—Mark D. Wisler
Attorney, Agent, or Firm—Irwin Ostroff; Erwin W. Pfeifle

[57] ABSTRACT

A double conversion frequency converter includes first and second mixing stages. The first mixing stage includes a first programable Local Oscillator (LO) synthesizer and a first mixer, and the second mixing stage includes a second programable LO synthesizer and a second mixer. The first and second LO synthesizers have a wide band tuning range for receiving a separate predetermined reference signal and generating therefrom first and second LO output signals, respectively, which each are changeable by predetermined large frequency steps. The first mixer mixes an input signal to the frequency converter with the first LO output signal for generating a first predetermined mixer output signal. The second mixer mixes a predetermined sideband generated in the first predetermined mixer output signal with the second LO output signal for generating a second predetermined mixer output signal which is use for the output signal for the frequency converter. The predetermined output signal of the frequency converter is changed in small frequency steps (e.g., at least 1 KHz) by concurrently changing each of the first and second LO output signals using large frequency step changes (e.g., at least 125 KHz) whereby the difference between the large frequency steps in the first and second LO output signals is equal to the small frequency step of the predetermined output signal.

8 Claims, 3 Drawing Sheets

SMALL FREQUENCY STEP UP OR DOWN CONVERTERS USING LARGE FREQUENCY STEP SYNTHESIZERS

FIELD OF THE INVENTION

The present invention relates to double conversion upconverters or downconverters which include first and second mixer stages connected in cascade that are supplied from separate programable Local Oscillator synthesizers.

BACKGROUND OF THE INVENTION

A frequency converter is used to convert a first input frequency to a higher or a lower second output frequency. For example, in certain transmitters, a baseband signal such as a television signal or a radio signal, or an Intermediate Frequency (IF), have to be upconverted to, for example, a Very High Frequency (VHF) signal or an Ultra High Frequency (UHF) signal within a certain channel or allotted frequency band. Similarly, at a receiver receiving the VHF or UHF signal, the VHF or UHF signal has to be downconverted to a baseband or an IF signal usable by the receiver.

In a known upconversion technique, an incoming baseband or IF signal is multiplied in a single Mixer with a signal produced by a Local Oscillator (LO) (e.g., a carrier signal) to directly produce an upconverted output signal that occupies a desired VHF or UHF channel or frequency band. A filter is used to pass one sideband of the mixing process that falls within the desired VHF or UHF channel or frequency band, and to block any undesired sidebands or a LO signal at the output of the Mixer from being transmitted. The problem with the single mixer upconverter is that generally at least one of the upper and lower sidebands and the LO signal fall within the higher VHF or UHF channel. As a result, a special bandpass filter is needed to just pass, for example, the upper sideband signal and reject the lower sideband and LO signal. Alternatively, a well-known tracking filter can be used that only tracks the desired output signal. Both of the special bandpass and tracking filters are difficult and expensive to implement. This limits the choice of options of the filters and other devices that can be used.

Upconverters which are programmable such that they can be utilized to generate signals on any selected channel within the VHF or UHF frequency band are known as "agile". Most "agile" conventional upconverters use a two stage (or double) conversion technique. The first stage of the conversion brings the incoming signal to a high frequency IF, and the second stage of the conversion brings the high frequency IF to the desired channel frequency. Each stage includes a mixer which receives an oscillator signal. The oscillator can comprise a programmable phase locked loop which has its output frequency regulated in accordance with a comparison between a sampling of the oscillator output signal (which is changeable) and a reference signal.

U.S. Pat. No. 5,038,404 (D. Marz), issued on Aug. 6, 1991, discloses an exemplary double upconversion technique that provides agility. More particularly, this upconverter comprises first and second mixer stages in cascade, where each mixer stage includes a separate programmable phase locked loop with an oscillator (LO) located therein which is controlled by a phase comparator or detector. The first mixer stage receives an IF signal [e.g., a 45.75 MHz signal for a National Television Systems Committee (NTSC) system], and upconverts the IF signal to a high IF signal (e.g., 720 MHz) which is above a desired output channel frequency range. The second mixer stage then downconverts the high IF signal to the frequency range of the desired UHF or VHF output channel. In this double upconversion arrangement, the first Local Oscillator associated with the first mixer stage has a relatively narrow or small tuning range (e.g., 3 MHz), while the second Local Oscillator associated with the second mixer stage has a very wide or large tuning range (e.g., 500 to 1000 MHz). As described in U.S. Pat. No. 5,038,404, an oscillator with a large tuning range suffers from a poor phase noise. It is also known that it is possible to design an oscillator with a narrow tuning range that provides excellent phase noise.

In the conventional upconverter described in U.S. Pat. No. 5,038,404 (or in a comparable downconverter), the output frequency of the upconverter can be changed by changing the first stage LO with the narrow tuning rage, the second stage LO with the wide tuning range, or both. When the first stage LO is changed while the second stage LO is kept unchanged, a small frequency change or step is achieved in the upconverted output signal. When the second stage LO is changed while the first stage LO is kept unchanged, a large frequency change or step is achieved in the upconverted output signal. Both LOs must be changed if an output frequency change is required which is larger than the large step change provided by the second stage LO but smaller than two times the smaller step change provided by the second stage LO to provide additive step changes. The problem in prior art upconverters having such first stage narrow tuning range oscillator and second stage wide tuning range oscillator, is that for making very small frequency step changes (in the order of KHz as required for 2.5 KHz frequency step Cable Television applications), the first narrow tuning range LO phase locked loop is very slow. Still further, if the first stage LO phase locked loop is disturbed (e.g., the upconverter is accidently bumped), the first stage LO will be slow in reacquiring lock due to the narrow band loop. In certain situations as, for example, the digital transmission of television signals, this is not acceptable because it results in a loss of a television picture, and an interruption of more than a second for the receiver at a customer's location to reacquire the picture.

It is desirable to provide an upconverter or a downconverter which allows for both small and large step converter output signal changes and achieves proper phase noise criteria while allowing for very fast reacquisition of the phase locked loops if any one of the first and second stage LO phase locked loops are disturbed.

SUMMARY OF THE INVENTION

The present invention is directed to frequency conversion techniques comprising first and second mixer stages connected in cascade that are supplied from first and second wide tuning range Programmable Local Oscillator (LO) synthesizers, respectively, that allow both small and large frequency step converter output signal changes, and very fast reacquisition of phase locked loops in the LO synthesizers if any one of the first and second LO synthesizers are disturbed.

Viewed from one aspect, the present invention is directed to a double conversion frequency converter comprising first and second wide tuning range programmable Local Oscillator (LO) synthesizers, and first and second mixers. The first and second programmable Local Oscillator (LO) synthesizers have first and second wide band tuning ranges, respectively, that receive respective first and second predetermined reference signals and generate therefrom first and second LO output signals, respectively, which are each changeable by predetermined separate large frequency steps of at least 125 KHz. Each of the first and second wide band tuning ranges are defined as having a frequency "$f_{hi}$" which equals a highest frequency of that wide band tuning range, a frequency "$f_{low}$" which equals a lowest frequency of that wide band tuning range, and a frequency band of that wide band tuning range which is represented by the Equation $(f_{hi}-f_{low})/f_{low} \geq 0.3$. The first mixer mixes an input signal to the frequency converter with the first LO output signal for generating a first predetermined output signal. The second mixer mixes a predetermined sideband generated in the first predetermined mixer output signal of the first mixer with the second LO output signal for generating a second predetermined mixer output signal which is used for an output signal of the frequency converter.

Viewed from another aspect, the present invention is directed to a method of providing a double frequency conversion of an input signal at a first frequency into an output signal at a second different frequency in a frequency converter. The method comprises the following steps. In a first step, a first predetermined reference signal is received and a first LO output signal is generated therefrom which is changeable by first large predetermined frequency steps of at least 125 KHz in a first programmable Local Oscillator (LO) synthesizer having a first wide band tuning range. The first wide band tuning range is defined as having a frequency "$f_{hi}$" which is equal to a highest frequency of the first wide band tuning range, a frequency "$f_{low}$" which is equal to a lowest frequency of the first wide band tuning range, and a frequency band of the first wide band tuning range which is represented by the Equation $(f_{hi}-f_{low})/f_{low} \geq 0.3$. In a second step, the input signal to the frequency converter is mixed with the first LO output signal generated in the first step in a first mixer to generate a first predetermined mixer output signal. In a third step, a second predetermined reference signal is received, and a second LO output signal is generated therefrom which is changeable by second large predetermined frequency steps of at least 125 KHz in a second programmable Local Oscillator (LO) synthesizer having a second wide band tuning range of at least 100 MHz. The second wide band tuning range is defined as having a frequency "$f_{hi}$" which is equal to a highest frequency of the second wide band tuning range, a frequency "$f_{low}$" which is equal to a lowest frequency of the second wide band tuning range, and a frequency band of the second wide band tuning range which is represented by the Equation $(f_{hi}-f_{low})/f_{low} \geq 0.3$. In a fourth step, a predetermined sideband generated in the first predetermined mixer output signal by the first mixer in the second step is mixed with the second LO output signal generated in the third step in a second mixer to generate a second predetermined mixer output signal which is used for an output signal of the frequency converter.

In accordance with the present invention, in each of the aspects described hereinabove, the output of the frequency converter is changeable in small frequency steps of at least 1 KHz by concurrently changing the first and second LO output signal frequencies by their respective first and second predetermined large frequency steps of at least 125 KHz so that a difference between the first and second large frequency steps generated by the first and second programmable LO synthesizers is equal to a desired small frequency step change of at least 1 KHz in the output signal of the frequency converter.

The invention will be better understood from the following more detailed description taken with the accompanying drawings and claims.

The drawings are not necessarily draw to scale.

DETAILED DESCRIPTION

Figures 1, 2:
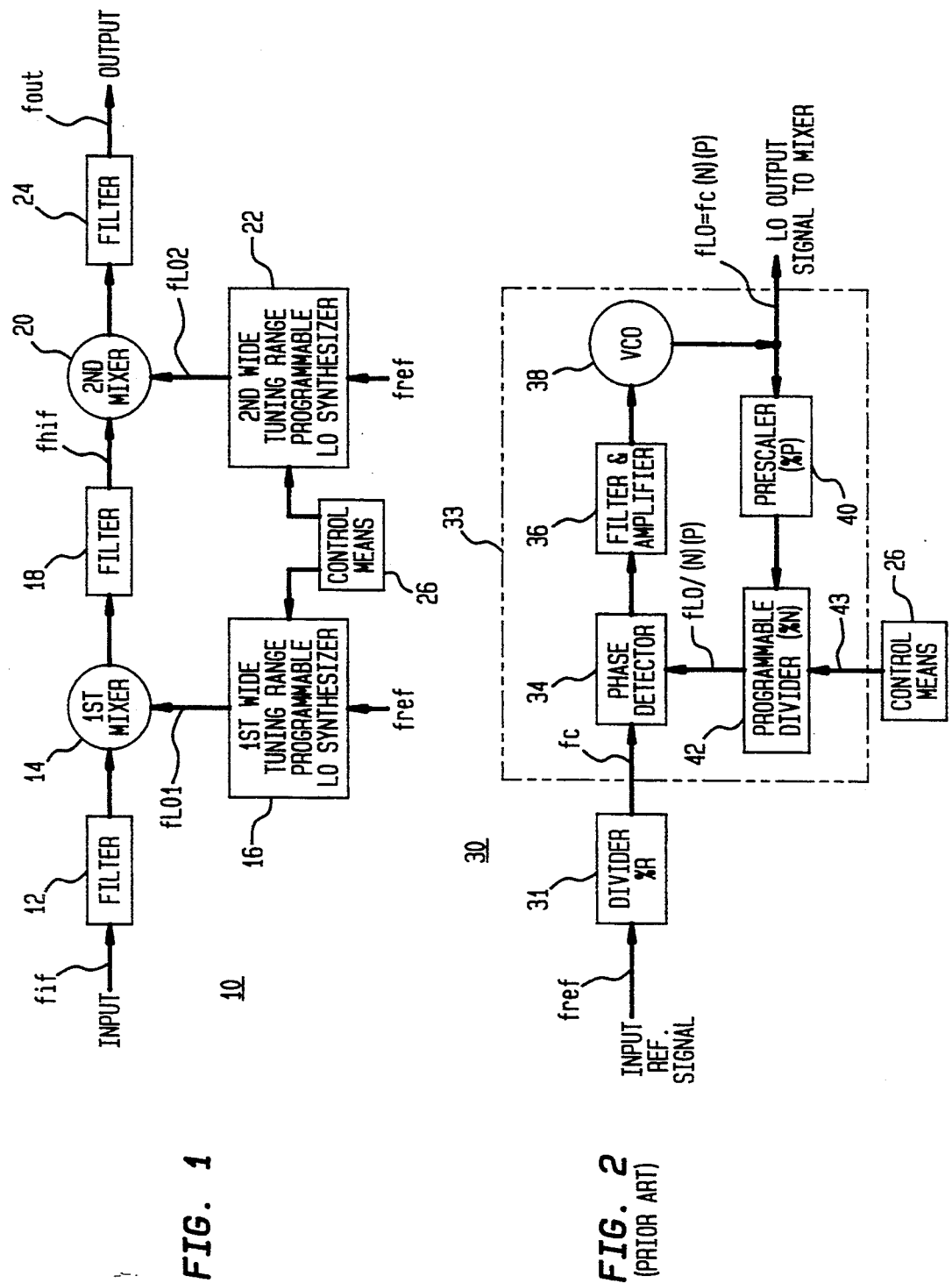
FIG. 1 is a block diagram of a double conversion frequency converter in accordance with the present invention.
FIG. 2 is a block diagram of a prior art programmable local oscillator synthesizer including a phase locked loop with an oscillator to generate a Local Oscillator (LO) output signal for use in the frequency converter of FIG. 1.

Referring now to FIG. 1, there is shown a block diagram of an frequency converter 10 in accordance with the present invention. It is to be understood that the frequency converter 10 arrangement can be used for both upconversion and downconversion, but it is described hereinafter only as an upconverter.

The upconverter 10 comprises a first filter 12, a first mixer 14, a first wide tuning range programmable Local Oscillator (LO) Synthesizer 16 which has a first very large or wide band tuning range (e.g., 500–1000 MHz), a second filter 18, a second mixer 20, a second wide tuning range programmable LO Synthesizer 22 which has a second very large or wide band tuning range (e.g., 500–1000 MHz), a third filter 24, and a control means 26. It is to be understood hereinafter that each of the first and second wide band tuning ranges are defined as having a frequency "$f_{hi}$" which equals a highest frequency of that wide band tuning range, a frequency "$f_{low}$" which equals a lowest frequency of that wide band tuning range, and a frequency band of that wide band tuning range which is represented by the Equation $(f_{hi}-f_{low})/f_{low} \geq 0.3$.

More particularly, the first filter 12 receives an input signal (designated "fif" hereinafter) and comprises either a lowpass filter for passing only a received baseband input signal, or a bandpass filter for passing a predetermined received intermediate frequency (IF) signal. The first wide tuning range programmable LO Synthesizer 16 generates a first LO output signal (designated "fLO1" hereinafter) from a received reference signal (designated "fref" hereinafter) and an input signal from the control means 26 as is well known in the art and is discussed hereinafter in more detail in relation to FIG. 2. The first mixer 14 receives a filter output signal from the first filter 12 and mixes the filter output signal with the first LO output signal (fLO1) received from the first programmable LO Synthesizer 16 to generate an output signal which includes the sum (upper sideband) and/or difference (lower sideband) between the two received signal, and possibly the first LO output signal (fLO1).

The second filter 18 is a bandpass filter which receives the output signal from the first mixer 14 and passes only one of the sidebands (e.g. the upper sideband of the mixing process in first mixer 14) which can be a High Intermediate Frequency signal and is designated "fhif" hereinafter. The second programmable LO Synthesizer 22 generates a second LO output signal (designated "fLO2" hereinafter) from a received reference signal (designated "fref" hereinafter) and an input signal from the control means 26 as is well known in the art and is discussed hereinafter in more detail. Each of the reference signals "fref" for the first and second programmable LO Synthesizers 16 and 22 can be generated from a single source or separate remote sources. The second mixer 20 receives the filter output signal "fhif" from the second filter 18 and mixes this signal with the second LO output signal (fLO2) received from the second programmable LO Synthesizer 22 to produce an output signal which includes the sum (upper sideband) and/or difference (lower sideband) between the two received signal, and possibly the second LO output signal (fLO2). The third filter 24 is a wide band bandpass filter which receives the output signal from the second mixer 20 and passes only one of the sidebands (e.g., the lower sideband of the mixing process in the second mixer 24). The output signal from the third filter 24 is designated "fout" hereinafter, and is the output signal from the upconverter 10. The "fout" signal represents a predetermined channel in, for example, the UHF or VHF frequency band. The third filter 24 has a passband that is as wide as the UHF or VHF frequency band in order to pass any of the channels produced by the upconverter 10.

The first and second LO Synthesizers 16 and 22 are programmable to generate predetermined fLO1 and fLO2 output signals, respectively, so that the output signal "fout" has a frequency of a predetermined channel in either the VHF or UHF frequency band. Additionally, the fLO1 and fLO2 signals are determined to prevent the fLO2 signal from falling within the desired UHF or VHF frequency band to which the third filter 24 is tuned. In accordance with the present invention, small frequency step changes (e.g., at least 1 KHz) can be obtained in the output signal "fout" in order to change from one channel to another by appropriately changing the frequency of both the fLO1 and fLO2 using large frequency steps (e.g., steps of at least 125 KHz). Such functioning will be described in greater detail hereinafter in relation to FIG. 3B. It is to be understood that the frequency converter 10 of FIG. 1 can also be used for downconverting a received UHF or VHF input signal and converting such received signal down to an IF signal or a baseband signal using the inverse procedure described hereinabove.

Referring now to FIG. 2, there is shown a block diagram of a known programmable LO Synthesizer 30 which can be used for each of the first and second programmable LO Synthesizers 16 and 22 of FIG. 1. LO Synthesizer 30 comprises a Divider 31, and a Phase Locked Loop (PLL) 33 (shown within a dashed line rectangle). The Divider 31 divides the input reference signal ("fref") by a predetermined number "R" to generate an output phase detector comparison signal (designated hereinafter as "fc"). The PLL 33 comprises a Phase Detector 34, a Filter and Amplifier 36, and a Voltage Controlled Oscillator (VCO) 38 connected in series between an input and an output of the PLL 33, and a Prescaler 40 and a Programmable Divider 42 located in a feedback loop between an output of the VCO 38 and an input to the Phase Detector 34. The Phase Detector 34 receives the "fc" signal having a predetermined frequency and phase at a first input thereof. The Phase Detector 34 also receives a second input signal [designated as fLO/(N) (P)] from the Programmable Divider 42 at a second input thereof, where the second input signal may include a phase delay or phase difference from the input signal that is produced within the circuitry of the programmable LO Synthesizer 30. For example, the phase delay equals 90 degrees when a known Double-Balanced Mixer is used for the Phase Detector 34, whereas the phase delay equals 0 degrees if a known Phase Frequency Detector is used for the Phase Detector 34. It is to be understood that in the programmable LO Synthesizer 30 used for the programmable LO Synthesizers 16 and 22 of FIG. 1, a Phase Frequency Detector is preferably used such that the phase delay equals 0 degrees.

The Phase Detector 34 compares the input phase detector comparison signal "fc" and the input signal fLO/(N) (P) from the Programmable Divider 42 to generate an output signal including a DC component and an AC component. The Filter and Amplifier 36 functions to remove the AC component produced within the Phase Detector 34, and to generate an output signal which is a substantially pure DC control signal that is amplified to a predetermined amplitude. The control signal from the Filter and Amplifier 36 is transmitted to the VCO 38 to adjust an output signal from the VCO 38 so that it has a substantially constant frequency and phase. The output signal from the VCO 38 is a signal having a phase and a frequency which is NP times higher than the input signal "fc" and designated as fLO which is equal to fc(N) (P), where N and P are predetermined percentages or numbers. The output signal from the VCO 38 is transmitted both as an output signal from the programmable LO Synthesizer 30 and to an input of the Prescaler 40. The Prescaler 40 divides the output signal from the VCO 38 by a divisor P to produce an output signal of fLO/N which is transmitted to the Programmable Divider 42. The Programmable Divider 42 divides the output signal from the Prescaler 40 by a divisor N, which is programmable by an input signal from a control means 26 (shown in FIG. 1), to generate the output signal Phase Detector 34. The values of P and N can be programmed into a look-up table in the Prescaler 40 and the Programmable Divider 42, respectively, by any suitable means as, for example, from an external microcomputer (not shown).

It is to be understood that the Prescaler 40 is an optional device which is added in front of the Programmable Divider 42 because Programmable Dividers are limited in their input frequency range. Therefore, the output "fLO" from the VCO 38 may have to be initially reduced by the Prescaler 40 to fall within an input frequency range of the Programmable Divider 42 when the output of the VCO 38 is not already within that input frequency range. Generally, the value of P used by the Prescaler 40 is not changed once programmed therein. The value of N used by the Programmable Divider 42 can be changed with a control input signal inputted via the control lead 43 from an external source (e.g., a microcomputer) whenever a new LO output signal is to be transmitted to a mixer for step changing an output signal from a frequency converter using the programmable LO synthesizer 30 to another output channel.

Figure 3A:
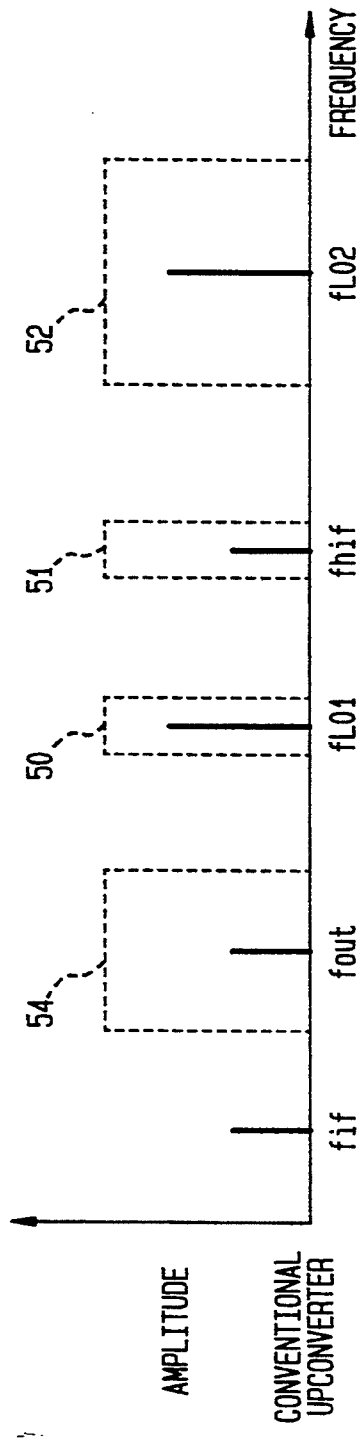
FIGS. 3A and 3B are graphs of amplitude versus frequency for exemplary signals found in both a prior art frequency upconverter and the frequency upconverter of FIG. 1 respectively.
Figure 3B:
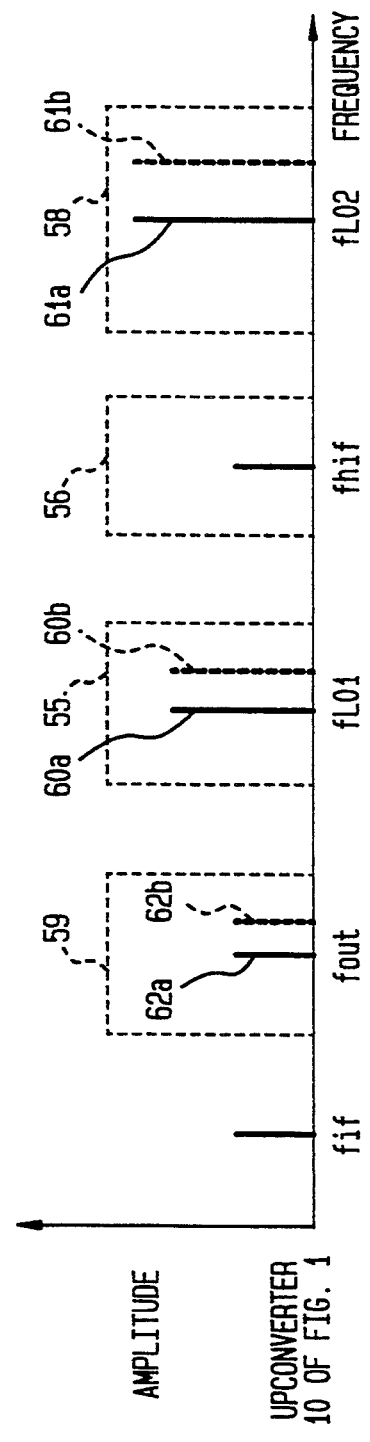

Referring now to FIGS. 3A and 3B, there are shown graphs of amplitude versus frequency for exemplary signals found in both a double conversion prior art upconverter and the upconverter 10 of FIG. 1, respectively. More particularly, FIG. 3A shows a graph of amplitude versus frequency for exemplary signals found in a double conversion prior art upconverter. FIG. 3B shows a graph of amplitude versus frequency for exemplary signals found in the double conversion upconverter 10 of FIG. 1. In the prior art upconverter associated with FIG. 3A, the "fif" input signal [e.g., a 45.75 MHz National Television Standards Committee signal (NTSC) signal] is initially upconverted in a first mixing stage (not shown) to a high IF ("fhif") signal (e.g., 720 MHz) which is above a frequency range 54 (shown within a dashed line rectangle) of a desired upconverter output channel "fout". A filter (similar to second filter 18 of FIG. 1) has a narrow passband 51 (shown within a dashed line rectangle) to receive the output signal from the first stage mixing process and pass the desired "fhif" signal while reject all other signals produced by the first stage mixing process. This initial upconversion is performed by the mixing of the "fif" input signal with a first Local Oscillator (LO) signal "fLO1" generated by a first programmable LO Synthesizer having a resistively small or narrow tuning range 50 (e.g., 3 MHz). The upconverted "fhif" signal in the frequency band 51 is then downconverted to the output channel signal "fout" in the frequency band 54 by the mixing of the "fif" input signal with a second LO signal "fLO2" generated by a second programmable LO Synthesizer having a large or wide tuning range 52 (e.g., 500–1000 MHz). It is known that an oscillator with a large or wide tuning range suffers from a poor phase noise, whereas is it possible to design an oscillator with a narrow tuning range that has excellent phase noise.

More particularly, in a double conversion up or down converter of the type shown, for example, in upconverter 10 of FIG. 1 (or in U.S. Pat. No. 5,038,404 (Marz), issued on Aug. 6, 1991), the high IF frequency signal "fhif" is equal to $$fhif = fLO1 + fif,$$

and the output signal is equal to $$fout = fLO2 - fhif.$$

By substituting for the fhif signal in the equation for fout, $$fout = fLO2 - (fLO1 + fif) = (fLO2 - fLO1) - fif.$$

A change in the output frequency is represented by $$\delta fout = \delta[fLO2 - fLO1] - fif].$$

Since the input signal fif is constant, then a frequency step change in the output signal is represented by $$\delta fout = \delta(fLO2 - fLO1) = \delta fLO2 - \delta fLO1. \qquad (1)$$

Returning now to FIG. 2, the frequency step of the programmable LO Synthesizer 30 is calculated as follows. The output LO frequency is equal to $$fLO = fc(N)(P),$$

where fc is the phase detector comparison frequency which is equal to the input reference signal "fref" divided by the divisor R used by Divider 31. Since the only variable is the possible change in the divisor N used by the programmable Divider 42, the frequency step change δfLO is:

$$\delta fLO = \delta[(fc)(N)(P)] = (fc)(P)(\delta N).$$

Assuming that δN can be as low as the number 1 (which is often the case), then the step of the Synthesizer 30 is:

$$\delta fLO = (fc)(P).$$

Where δN=1, an exemplary small frequency step programmable LO Synthesizer 30 has a phase detector comparison frequency "fc" of 1 KHz, and a Prescaler 40 that uses a factor or divisor (P) equal to the number 2. Such small frequency step programmable LO Synthesizer 30 provides output frequency change steps of 2 KHz. An exemplary large step programmable LO Synthesizer 30 has an "fc" as an input to the Phase Detector 34 of FIG. 2 of 250 KHz, and a Prescaler 40 that uses a factor or divisor (P) equal to the number 8. Such exemplary large step programmable LO Synthesizer 30 provides output frequency change steps of 2 MHz.

In the Phase Locked Loop 33, the LO output frequency fLO is related to the comparison frequency [fLO/(N)(P)] of the Phase Detector 34 as follows:

$$fLO = (N)(P)(fc) = (M)(fc),$$

where M is equal to the product of the divisors used by the Programmable LO Divider 42 and the Prescaler 40. Therefore, for a double conversion up or down converter, $$fLO1 = (M1)(fc1), \text{ and } FLO2 = (M2)(fc2),$$

where fLO1 is the programmable LO synthesizer output signal used by the first stage of the double conversion converter, and fLO2 is the programmable LO synthesizer output signal used by the second stage of the double conversion converter.

The frequency steps of the programmable LO Synthesizers in a double conversion frequency converter are:

$$\text{step } LO1 = \delta[(M1)(fc1)],$$

$$\text{step } LO2 = \delta[(M2)(fc2)],$$

where fc1 and fc2 are the comparison frequencies (fc) for the programmable LO synthesizers 30 used in the first and second stages, respectively, of conversion. Since fc1 and fc2 are of a constant value, then $$\text{step } LO1 = (\delta M1)(fc1),$$

$$\text{step } LO2 = (\delta M2)(fc2),$$

and the change in the output frequency of the double conversion frequency converter is $$\delta fout = \delta[(fLO2-fLO1)-fif] = \delta(fLO2-fLO1),$$

$$\delta fout = \delta fLO2 - \delta fLO1 = \delta[(M2)(fc2)-(M1)(fc1)],$$

$$\delta fout = (\delta M2)(fc2) - (\delta M1)(fc1). \quad (2)$$

Equation (2) indicates that a change of the signal "fout" is proportional to the second stage comparison frequency "fc2" and the first stage comparison frequency "fc1".

In a prior art double conversion frequency converter, in order to attain a small frequency step in the output signal of the frequency converter, the value of the second stage LO signal (fLO2) remains constant ($\delta M2=0$), and the first stage LO signal (fLO1) is changed by reprogramming the value of the divisor N1 used by the Programmable Divider 42 (shown in FIG. 2) in the first stage programmable LO Synthesizer. As a result, the output frequency step "$\delta fout$" is:

$$\delta fout = -(\delta M1)(fc1) = -\delta[(P)(N1)](fc1). \quad (3)$$

Phase noise is a critical parameter in the design of high performance upconverters for, for example, Television applications.

In U.S. Pat. No. 5,038,404 cited hereinabove, an agile double conversion upconverter is described in which the first and second stage local oscillators (LOs) are synthesized, and the phase locked loops of the LOs are designed so that the output frequency steps of both LOs (the achievable step changes in frequency fLO1 and fLO2) and phase noise are achieved at the same time. In the patented double conversion upconverter, the first stage LO output signal (fLO1) has a small comparison frequency (fc1) while the second stage LO output signal (fLO2) has a large comparison frequency (fc2). By having a large comparison frequency (fc2), the phase locked loop of the second stage programmable LO Synthesizer "cleans" the close in phase noise of the second stage LO output signal (fLO2). However, a large comparison frequency (fc2) leads to large frequency steps ($\delta fLO2$) as shown by Equation (1). On the other hand, because the first stage programmable LO Synthesizer is a narrow band oscillator, its phase noise characteristics are good and does not have to be "cleaned up". As a result, a small comparison frequency (fc1) can be used which provides a small frequency step ($\delta fLO$). In the patented double conversion upconverter, the output frequency (fout) can be changed by changing the LO output frequencies of both the first stage programmable LO synthesizer, the second stage programmable LO synthesizer, or both. If the first stage programmable LO synthesizer output frequency is changed, then a small frequency step is achieved in the upconverter output signal (fout). If the second stage programmable LO synthesizer output frequency is changed while the first stage programmable LO synthesizer output frequency is not changed, then a large frequency step is achieved in the upconverter output signal (fout). However, both the first and second stage programmable LO synthesizer output frequencies must be changed when a desired output frequency change is larger than a frequency step change possible with the second stage programmable LO synthesizer but smaller than two times such frequency step change possible with the second stage programmable LO synthesizer.

The problem with the patented double conversion frequency converter is that for very small frequency steps (in the order of KHz as, for example, for Cable Television where a 2.5 KHz is desirable), the narrow tuning band first stage LO phase locked loop (e.g., PLL 33 shown in FIG. 2) is very slow to acquire the new LO frequency. Still further, if for some reason the narrow tuning band first stage LO PLL is disturbed (e.g., by the circuit being shaken or bumped), the LO Synthesizer is slow in reacquiring a lock. In certain situations, like in digital transmission of Television signals, this is not acceptable because it leads to losing the picture, and an interruption of more than a second for the receiver to reacquire the picture.

Returning now to FIG. 3B, there is shown a graph of amplitude versus frequency for exemplary signals found in the double conversion upconverter 10 of FIG. 1 in accordance with the present invention. More particularly, the "fif" input signal [e.g., a 45.75 MHz National Television Standards Committee (NTSC) signal] is initially upconverted to a high IF ("fhif") signal within a predetermined high IF frequency range 56 (shown within a dashed line rectangle) used as the passband of second filter 18 (shown in FIG. 1). The "fhif" signal is above a desired upconverter output channel "fout" 62a which falls within a frequency range 59 (shown within a dashed line rectangle) representing the known VHF or UHF frequency band. This initial upconversion is performed by the mixing of the "fif" input signal with a first Local Oscillator (LO) output signal "fLO1" generated by a first programmable LO Synthesizer 16 (shown in FIG. 1) having a large or wide tuning range 55 (e.g., 500–1000 MHz shown with a dashed line rectangle). The upconverted "fhif" signal in the frequency passband 56 of the second filter 18 is then downconverted to the output channel signal "fout" 62a in the frequency band 59 by the mixing of the "fhif" signal with a second LO output signal 61a ("fLO2") generated by the second programmable LO Synthesizer 22 (shown in FIG. 1) having a large or wide tuning range 58 (e.g., 500–1000 MHz and shown within a dashed line rectangle). Each of the first and second programmable LO Synthesizers 16 and 22 also have a large comparison frequency (shown as "fc" only in FIG. 2) in the order of, for example, 250 KHz. With such wide tuning range, both of the programmable LO Synthesizers 16 and 22 have phase locked loops 33 (shown only in FIG. 2) which allow for a very fast reacquisition if the phase locked loops 33 are disturbed.

Equation (2) indicates that the output frequency step ($\delta fout$) is the difference between the frequency step ($\delta LO1$) obtainable in the first stage programmable LO Synthesizer 16 and the frequency step ($\delta LO2$) obtainable in the second stage programmable LO Synthesizer 22. Although prior art double conversion upconverters keep one Local Oscillator fixed (e.g., LO1) while changing the other Local Oscillator (e.g., LO2), it is to be understood that the output frequency step ($\delta fout$) is the difference between the Local Oscillator steps as indicated in Equation (2). Therefore, in accordance with the present invention, the actual frequency step ($\delta fLO$) of each of the first and second stage programmable LO Synthesizers 16 and 22 can be made as large as desired as long as their fLO1 and fLO2 output signal difference is equal to the required output frequency step ($\delta fout$). This allows the use of phase locked loops that quickly reacquire lock if disturbed.

As shown in FIG. 3B, if the first programmable LO Synthesizer 16 output signal frequency fLO1 is stepped to a frequency shown by dashed line 60b, and the second stage programmable LO Synthesizer 22 output signal frequency fLO2 is stepped to a frequency shown by dashed line 61b, the difference between fLO2, 61b, and fLO1, 60b generates an output signal "fout" having a frequency shown by the dashed line 62b. Therefore, by using large frequency steps in each of the first and second programmable LO Synthesizers 16 and 22, a small output frequency step ($\delta$fout) is obtained.

More particularly, assuming that the double conversion frequency converter 10 of FIG. 1 has requirements that the output frequency step ($\delta$fout) equals 12.5 KHz, a comparison frequency of the second stage programmable LO Synthesizer 22 (fc2) approximates 250 KHz, and $\delta M1 = \delta M2 = \delta M = 4$, then from Equation (2)

$$\delta fout = (\delta M2)(fc2) - (\delta M1)(fc1),$$

$$\delta fout = (\delta M)(fc2 - fc1) = 12.5 \text{ KHz}.$$

Therefore, $$(fc2 - fc1) = 12.5/\delta M \text{ KHz} = 3.125 \text{ KHz}. \quad (4)$$

Figure 4:
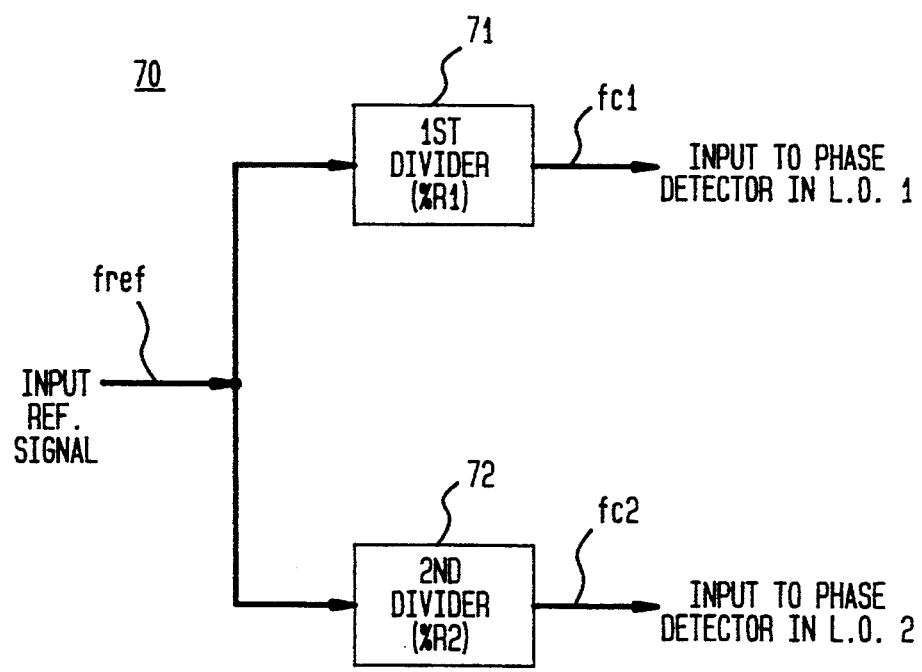
FIG. 4 is a block diagram of an arrangement for providing a single input reference to a first and second LO synthesizer of the type shown in FIG. 2 that supply separate LO signals to first and second mixer stages, respectively, in the frequency converter of FIG. 1.

Referring now to FIG. 4, there is shown a block diagram of an arrangement 70 for providing first and second comparison frequencies (fc1 and fc2) from a single input reference signal (fref). More particularly, the input reference signal "fref" is split into first and second equal portions with the first portion being supplied as an input to a first Divider (%R1) 71, and the second portion being supplied as an input to a second Divider (%R2) 72. The first and second Dividers 71 and 72 divide the received input reference signal "fref" by divisors R1 and R2, respectively, to generate the respective first and second comparison frequencies fc1 and fc2. These first and second comparison frequencies fc1 and fc2 are transmitted to the phase locked loops 33 (only shown in FIG. 2) in the first and second programmable LO Synthesizer 16 and 22, respectively, that supply separate LO signals to the respective first and second Mixers 14 and 20 in the upconverter 10 of FIG. 1.

Using the arrangement 70, $$fref = (fc1)(R1) = (fc2)(R2), \quad (5)$$

and $$fc1 = (fc2)(R2/R1). \quad (6)$$

Replacing Equation (6) in Equation (4), $$fc2 - (fc2)(R2/R1) = 3.125 \text{ KHz},$$

$$(fc2)(1 - R2/R1) = 3.125 \text{ KHz},$$

$$(fc2)[(R1 - R2)/R1] = 3.125 \text{ KHz},$$

$$fc2 = [R1/(R1 - R2)](3.125 \text{ KHz}),$$

and $$R1/(R1 - R2) = fc2/3.125 = 250/3.125 = 80. \quad (7)$$

Therefore, for R1=80 and R2=79, from Equation (7) it is shown that $$fref = (fc2)(R2) = (250 \text{ KHz})(79) = 19.75 \text{ MHz},$$

$$fc1 = 19.75/80 \text{ MHz} = 246.875 \text{ KHz},$$

$$\delta fLO1 = (\delta M)(fc1) = (4)(246.875 \text{ KHz}) = 987.5 \text{ KHz}, \quad (8)$$

and $$\delta fLO2 = (\delta M)(fc2) = (4)(250 \text{ KHz}) = 1000 \text{ KHz} = 1 \text{ MHz}. \quad (9)$$

In order to find a minimum width (or passband frequency range 56 shown in FIG. 3B) of the second filter 18 shown in FIG. 1, the possible amount of frequency change of the first LO frequency (fLO1) must be known. It is known from Equation (9) that by only changing the second LO frequency (fLO2), an output frequency change of 1 MHz is obtained. To determine the number "S" of small steps (changing both fLO1 and fLO2) that are necessary to attain one large step, $$(S)(\delta fLO2 - \delta fLO1) = \delta fLO2,$$

$$(S)(12.5 \text{ KHz}) = 1000 \text{ KHz},$$

and $$S = 80.$$

From Equation (8), the change in the "fhif" signal is equal to the change in the first stage LO signal LO1 where $$\delta fhif = \delta fLO1 = (S-1)(876.5 \text{ KHz}) = 78.0125 \text{ MHz}.$$

Therefore, the second filter 18 of FIG. 1 should have a passband that is at least 78.0125 MHz wide.

It is to be appreciated and understood that the specific embodiments of the invention described hereinabove are merely illustrative of the general principles of the invention. Various modifications may be made by those skilled in the art which are consistent with the principles set forth.

What is claimed is:

1. A double conversion frequency converter comprising:

a first programmable Local Oscillator (LO) synthesizer having a first wide band tuning range for receiving a first predetermined reference signal from a control means and generating therefrom a first LO1 output signal which is changeable by first predetermined first large frequency steps of at least 125 KHz, where the first wide band tuning range is defined as having a frequency $f_{hi1}$ which equals a highest frequency of the first wide band tuning range, a frequency $f_{low1}$ which equals a lowest frequency of the first wide band tuning range, and a frequency band of the first wide band tuning range which is represented by $$[(f_{hi} - f_{low})/f_{low}](f_{hi1} - f_{low1})/f_{low1} \geq 0.3;$$

a first mixer for mixing an input signal to the frequency converter with the first LO1 output signal for generating a first predetermined mixer output signal;

a second programmable Local Oscillator (LO) synthesizer having a second wide band tuning range of at least 100 MHz for receiving a second predetermined reference signal from the control means and generating therefrom a second LO2 output signal which is changeable by predetermined second large frequency steps of at least 125 KHz, where the second wide band tuning range is defined as having a $f_{hi2}$ which equals a highest frequency of the second wide band tuning range, a frequency $f_{low2}$ which equals a lowest frequency of the second wide band tuning range, and a frequency band of the second wide band tuning range which is represented by $$[(f_{hi}-f_{low})/f_{low}](f_{hi2}-f_{low2})/f_{low2} \geq 0.3; \text{ and}$$

a second mixer for mixing a predetermined sideband generated in the first predetermined mixer output signal of the first mixer with the second LO2 output signal for generating a second predetermined mixer output signal which is used for an output signal of the frequency converter.

2. The double conversion frequency converter of claim 1 wherein the output of the frequency converter is changeable in small frequency steps of at least 1 KHz by concurrently changing the first and second LO output signal frequencies by their respective first and second predetermined large frequency steps in response to the first and second predetermined reference signals, respectively, from the control means wherein a difference between the first and second large frequency steps generated by the first and second programmable LO synthesizers is equal to a desired small frequency step change in the output signal of the frequency converter.

3. The double conversion frequency converter of claim 1 wherein the first and second predetermined mixer output signals from the first and second mixers, respectively, comprise an upper and a lower sideband of the mixing of an input signal and an associated one of the first and second LO output signals, the frequency converter further comprising:

a first filter for receiving the first predetermined mixer output signal from the first mixer and passing only a predetermined one of the upper or lower sidebands, the sideband passed by the first filter being provided as an input signal to the second mixer; and a second filter for receiving the second predetermined mixer output signal from the second mixer and passing only a predetermined one of the upper or lower sidebands as an output signal of the frequency converter.

4. A double conversion frequency converter comprising:

a first programmable Local Oscillator (LO) synthesizer having a first wide band tuning range for receiving a first predetermined reference signal from a control means and generating therefrom a first LO1 output signal which is changeable by first predetermined large frequency steps of at least 125 KHz, where the first wide band tuning range is defined as having a frequency $f_{hi1}$ which equals a highest frequency of the first wide band tuning range, a frequency $f_{low1}$ which equals a lowest frequency of the first wide band tuning range, and a frequency band of the first wide band tuning range which is represented by $$[(f_{hi}-f_{low})/f_{low}](f_{hi1}-f_{low1})/f_{low1} \geq 0.3;$$

a first mixer for mixing an input signal to the frequency converter with the first LO1 output signal for generating a first predetermined mixer output signal comprising at least an upper and a lower sideband of the mixing of the input signal and the first LO1 output signal;

a first filter for receiving the first predetermined mixer output signal and passing only a predetermined one of the upper or lower sidebands;

a second programmable Local Oscillator (LO) synthesizer having a second wide band tuning range for receiving a second predetermined reference signal from the control means and generating therefrom a second LO2 output signal which is changeable by second predetermined large frequency steps of at least 125 KHz, where the second wide band tuning range is defined as having a frequency $f_{hi2}$ which equals a highest frequency of the second wide band tuning range, a frequency $f_{low2}$ which equals a lowest frequency of the second wide band tuning range, and a frequency band of the second wide band tuning range which is represented by $$[(f_{hi}-f_{low})/f_{low}](f_{hi2}-f_{low2})/f_{low2} \geq 0.3; \text{ and}$$

a second mixer for mixing the predetermined upper or lower sideband passed by the first filter with the second LO2 output signal for generating a second predetermined mixer output signal comprising at least an upper sideband and a lower sideband of the mixing of the sideband from the first filter and the second LO2 output signal; and a second filter for receiving the second predetermined mixer output signal and passing only a predetermined one of the upper or lower sidebands as an output signal of the frequency converter, where the output of the frequency converter is changeable in small frequency steps of at least 1 KHz by concurrently changing the first and second LO output signal frequencies by their first and second predetermined large frequency steps, respectively, wherein a difference between the first and second predetermined large frequency steps generated by the respective first and second programmable LO synthesizers is equal to a desired small frequency step change in the output signal of the frequency converter.

5. A method of providing a double frequency conversion of an input signal at a first frequency into an output signal at a second different frequency in a frequency converter, the method comprising the steps of:

(a) receiving a first predetermined reference signal from a control means and generating therefrom a first LO1 output signal which is changeable by first large predetermined frequency steps of at least 125 KHz in a first programmable Local Oscillator (LO) synthesizer having a first wide band tuning range, where the first wide band tuning range is defined as having a frequency $f_{hi1}$ which equals a highest frequency of the first wide band tuning range, a frequency $f_{low1}$ which equals a lowest frequency of the first wide band tuning range, and a frequency band of the first wide band tuning range which is represented by $$[(f_{hi}-f_{low})/f_{low}](f_{hi1}-f_{low1})/f_{low1} \geq 0.3;$$

(b) mixing the input signal to the frequency converter with the first LO1 output signal generated in step (a) in a first mixer for generating a first predetermined mixer output signal;

(c) receiving a second predetermined reference signal from the control means and generating therefrom a second LO2 output signal which is changeable by second large predetermined frequency steps of at least 125 KHz in a second programmable Local Oscillator (LO) synthesizer having a second wide band tuning range, where the second wide band tuning range is defined as having a frequency $f_{hi2}$ which equals a highest frequency of the second wide band tuning range, a frequency $f_{low2}$ which equals a lowest frequency of the second wide band tuning range, and a frequency band of the second wide band tuning range which is represented by $$[(f_{hi}-f_{low})/f_{low}](f_{hi2}-f_{low2})/f_{low2} \geq 0.3;\text{ and}$$

(d) mixing a predetermined sideband generated in the first predetermined mixer output signal by the first mixer in step (b) with the second LO2 output signal generated in step (c) in a second mixer for generating a second predetermined mixer output signal which is used for an output signal of the frequency converter.

6. The method of claim 5 wherein in performing steps (a) to (d), changing the output signal of the frequency converter by small frequency steps of at least 1 KHz by concurrently changing the first and second LO output signal frequencies generated in steps (a) and (c) by their first and second large predetermined frequency steps, respectively, in response to the respective first and second predetermined reference signals from the control means wherein the difference between the first and second large frequency steps generated by the respective first and second programmable LO synthesizers is equal to a desired small frequency step change in the output signal of the frequency converter.

7. The method of claim 5 wherein the first and second predetermined mixer output signals from the first and second mixers, respectively, in steps (b) and (d) comprises an upper and a lower sideband of the mixing of an input signal and an associated one of the first and second LO output signals, the method comprising the further steps of:

(e) prior to performing step (d), receiving the first predetermined mixer output signal from the first mixer in step (b), and filtering the first predetermined mixer output signal for passing only a predetermined one of the upper or lower sidebands which is provided as an input signal to the second mixer in step (d); and (f) subsequent to performing step (d), receiving the second predetermined mixer output signal from the second mixer and filtering the second predetermined mixer output signal for passing only a predetermined one of the upper or lower sidebands as an output signal of the frequency converter.

8. A method of providing a double frequency conversion of an input signal at a first frequency into an output signal at a second different frequency in a frequency converter, the method comprising the steps of:

(a) receiving a first predetermined reference signal from a control means and generating therefrom a first LO1 output signal which is changeable by first large predetermined frequency steps of at least 125 KHz in a first programmable Local Oscillator (LO) synthesizer having a first wide band tuning range, where the first wide band tuning range is defined as having a frequency $f_{hi1}$ which equals a highest frequency of the first wide band tuning range, a frequency $f_{low1}$ which equals a lowest frequency of the first wide band tuning range, and a frequency band of the first wide band tuning range which is represented by $$[(f_{hi}-f_{low})/f_{low}](f_{hi1}-f_{low1})/f_{low1} \geq 0.3;$$

(b) mixing the input signal to the frequency converter with the first LO1 output signal generated in step (a) in a first mixer for generating a first predetermined mixer output signal comprising an upper and a lower sideband of the mixing of the input signal and the first LO1 output signal;

(c) filtering the first predetermined mixer output signal in a first filter and passing only a predetermined one of the upper or lower sidebands;

(d) receiving a second predetermined reference signal from the control means and generating therefrom a second LO2 output signal which is changeable by second large predetermined frequency steps of at least 125 KHz in a second programmable Local Oscillator (LO) synthesizer having a second wide band tuning range, where the second wide band tuning range is defined as having a frequency $f_{hi2}$ which equals a highest frequency of the second wide band tuning range, a frequency $f_{low2}$ which equals a lowest frequency of the second wide band tuning range, and a frequency band of the second wide band tuning range which is represented by $$[(f_{hi}-f_{low})/f_{low}](f_{hi2}-f_{low2})/f_{low2} \geq 0.3;\text{ and}$$

(e) mixing a predetermined sideband generated in the first predetermined mixer output signal by the first mixer in step (b) with the second LO2 output signal generated in step (c) in a second mixer for generating a second predetermined mixer output signal comprising at least an upper sideband and a lower sideband of the mixing of the sideband passed in step (c) from the first filter and the second LO2 output signal; and (f) filtering the second predetermined mixer output signal in a second filter and passing only a predetermined one of the upper or lower sidebands as an output signal of the frequency converter, where the output of the frequency converter is changeable in small frequency steps of at least 1 KHz by concurrently changing the first and second LO output signal frequencies by their first and second predetermined large frequency steps, respectively, in response to the respective first and second predetermined reference signals from the control means wherein a difference between the first and second predetermined large frequency steps generated by the respective first and second programmable LO synthesizers is equal to a desired small frequency step change in the output signal of the frequency converter.

* * * * *